(12) United States Patent
Gong

(10) Patent No.: US 11,051,423 B2
(45) Date of Patent: Jun. 29, 2021

(54) MULTI-LAYER EXPANSION CARD BUFFER BRACKET

(71) Applicant: ZHENGZHOU YUNHAI INFORMATION TECHNOLOGY CO., LTD., Henan (CN)

(72) Inventor: Baolong Gong, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 0 days.

(21) Appl. No.: 16/475,094

(22) PCT Filed: Jun. 13, 2018

(86) PCT No.: PCT/CN2018/090981
§ 371 (c)(1),
(2) Date: Jun. 29, 2019

(87) PCT Pub. No.: WO2019/052240
PCT Pub. Date: Mar. 21, 2019

(65) Prior Publication Data
US 2019/0335605 A1  Oct. 31, 2019

(30) Foreign Application Priority Data
Sep. 15, 2017 (CN) .................. 201710832540.X

(51) Int. Cl.
*H05K 7/14* (2006.01)
*F16F 1/12* (2006.01)
(Continued)

(52) U.S. Cl.
CPC .......... *H05K 7/1489* (2013.01); *F16F 1/128* (2013.01); *F16F 3/10* (2013.01); *F16F 15/085* (2013.01); *F16M 13/02* (2013.01)

(58) Field of Classification Search
CPC ......... H05K 7/1489; H05K 7/18; F16F 1/128; F16F 3/10; F16F 15/085; F16M 13/02
(Continued)

(56) References Cited

U.S. PATENT DOCUMENTS 3,547,393 A * 12/1970 Gordin ..................... A47C 3/18
                                                        248/582
3,881,713 A *  5/1975 Joyce ........................ F16F 1/12
                                                        267/131

(Continued)

FOREIGN PATENT DOCUMENTS

CN         2659089 Y    11/2004
CN         2925016 Y     7/2007
(Continued)

OTHER PUBLICATIONS

International Search Report for PCT/CN2018/090981 dated Sep. 20, 2018, ISA/CN.

*Primary Examiner* — Stanton L Krycinski
(74) *Attorney, Agent, or Firm* — Yue (Robert) Xu; Apex Attorneys at Law, LLP

(57) ABSTRACT

A buffer bracket for multi layers of expansion cards is provided, which includes: an elastic base, a first supporting plate and a plurality of second supporting plates which are sequentially arranged from bottom to top, wherein the first supporting plate is fixedly connected to the elastic base, the first supporting plate is slidably connected to the adjacent second supporting plate, and the adjacent second supporting plates are slidably connected.

11 Claims, 5 Drawing Sheets

(51) Int. Cl.
*F16F 3/10* (2006.01)
*F16F 15/08* (2006.01)
*F16M 13/02* (2006.01)

(58) Field of Classification Search
USPC .................................... 361/679.35, 679.36
See application file for complete search history.

(56) References Cited

U.S. PATENT DOCUMENTS

| | | | | |
|---|---|---|---|---|
| 4,426,076 | A * | 1/1984 | Palmer | A63B 5/08 |
| | | | | 108/136 |
| 5,566,156 | A * | 10/1996 | Choi | G11B 17/0434 |
| | | | | 360/99.06 |
| 5,772,191 | A * | 6/1998 | Nakano | F16F 1/122 |
| | | | | 267/179 |
| 6,252,768 | B1 * | 6/2001 | Lin | G06F 1/1616 |
| | | | | 248/624 |
| 6,575,439 | B1 * | 6/2003 | Costello | F16F 1/128 |
| | | | | 267/179 |
| 6,964,412 | B2 * | 11/2005 | Costello | F16B 21/071 |
| | | | | 267/179 |
| 7,092,251 | B1 * | 8/2006 | Henry | G11B 25/043 |
| | | | | 248/618 |
| 8,480,052 | B2 * | 7/2013 | Taylor | G11B 33/08 |
| | | | | 248/638 |
| 9,359,135 | B2 * | 6/2016 | Nagamine | H01L 21/67769 |
| 10,125,843 | B2 * | 11/2018 | Runge | F16F 15/046 |
| 2006/0061954 | A1 * | 3/2006 | Lam | G06F 1/184 |
| | | | | 361/679.35 |
| 2006/0255517 | A1 * | 11/2006 | Lee | F16F 13/005 |
| | | | | 267/148 |
| 2013/0048814 | A1 | 2/2013 | Zhou | |

FOREIGN PATENT DOCUMENTS

| | | |
|---|---|---|
| CN | 201780541 U | 3/2011 |
| CN | 203287821 U | 11/2013 |
| CN | 203561929 U | 4/2014 |
| CN | 107632669 A | 1/2018 |

* cited by examiner

MULTI-LAYER EXPANSION CARD BUFFER BRACKET

The application is the national phase of International Application No. PCT/CN2018/090981, titled "MULTI-LAYER EXPANSION CARD BUFFER BRACKET", filed on Jun. 13, 2018, which claims the priority to Chinese patent application No. 201710832540.X titled "BUFFER BRACKET FOR MULTI LAYERS OF EXPANSION CARDS", filed with the China National Intellectual Property Administration on Sep. 15, 2017, the entire disclosures of the applications are incorporated herein by reference.

FIELD

The present application relates to server hardware devices, and in particular to a buffer bracket for multi layers of expansion cards for preventing the expansion cards from being bent and deformed by collision in an application server.

BACKGROUND

An expansion card is inserted into a PCI-E slot, to play an expansion function. As shown in FIG. 9, generally, in a server casing, the expansion card has one end fixedly connected to the casing, and another end being suspended. During packaging transportation and bare-computer carrying process, the server is at risk of falling and being impacted. The expansion card is apt to be bent and deformed by collision or vibration, resulting in failure and damage of the expansion card. Therefore, adding an appropriate reinforcing and supporting device to assist in supporting the expansion card can effectively protect the expansion card and reduce the risk of failure.

At present, a simple metal or plastic bracket is often used for simply fixing and supporting the expansion card, which may cause the following problems.

First, there is no buffer structure which can protect the expansion card to a certain extent when the expansion card is subjected to vibration, thus when the expansion card is subjected to collision or strong vibration, due to the rigid connection between the expansion card and the supporting structure, the expansion card is more prone to be damaged and lose efficacy.

Second, with the rapid development of electronic components, the installation density of electronic components in the casing is getting higher, and the installation method shown in FIG. 9 often appears, that is, the multi layers of expansion cards are stacked and installed in the casing. However, most of the traditional brackets can only fix a single layer and cannot meet the supporting requirement of the multi layers of expansion cards.

SUMMARY

In view of the above problems, a buffer bracket for multi layers of expansion cards is provided according to the present application, which can not only meet the installation requirement of the multi layers of expansion cards, but also be adjusted in real time according to the distance between the expansion cards, and is convenient to install.

The following technical solution is provided according to the present application to solve the above technical problem.

A buffer bracket for multi layers of expansion cards is provided, which includes: an elastic base, a first supporting plate and a plurality of second supporting plates which are sequentially arranged from bottom to top, wherein the first supporting plate is fixedly connected to the elastic base, the first supporting plate is slidably connected to the adjacent second supporting plate, and the adjacent second supporting plates are slidably connected.

Further, the elastic base includes a bottom plate and a fixing plate, the bottom plate is provided with a guiding pillar, the fixing plate is provided with a guiding sleeve for cooperating with the guiding pillar, and a spring is sleeved on an outer side of the guiding sleeve.

Further, a lower end of the guiding sleeve is provided with a buffer cushion block made of rubber.

Further, the guiding pillar extends upward from the bottom plate, the guiding sleeve extends downward from the fixing plate, the guiding sleeve is sleeved on the guiding pillar from top to bottom, the first supporting plate is fixedly connected to the fixing plate, and upper and lower ends of the spring respectively abut against the bottom plate and the fixing plate.

Further, an upper side surface of the first supporting plate is provided with a first sliding plate, an upper side surface of each of the second supporting plates is provided with a second sliding plate, and a lower side surface of each of the second supporting plates is provided with a guiding slot; when the first supporting plate is connected to the adjacent second supporting plate, the guiding slot is engaged with the first sliding plate; and when two adjacent second supporting plates are connected, the guiding slot is engaged with the second sliding plate on the adjacent second supporting plate; and the guiding slot is provided with a positioning screw, and the first sliding plate and the second sliding plate are respectively provided with a first oblong hole and a second oblong hole for accommodating the positioning screw.

Further, the lower side surface of each of the second supporting plates is provided with a first guiding plate and a second guiding plate at positions corresponding to left and right sides of the first sliding plate or the second sliding plate, and the guiding slot is formed by the first guiding plate and the second guiding plate; the positioning screw is provided in the guiding slot by passing through the first guiding plate and the second guiding plate in a left-right direction, a length direction of each of the first oblong hole and the second oblong hole is an up and down direction, and the first oblong hole and the second oblong hole are slidably engaged with the positioning screw in the up and down direction to achieve the slidable connections between the first supporting plate and the adjacent second supporting plate and between the adjacent second supporting plates.

Further, an inner side of the first supporting plate and an inner side of the second supporting plate are respectively provided with a first installing plate and a second installing plate for connecting the expansion card, the first installing plate and the second installing plate are respectively provided with a first limiting plate and a second limiting plate, one end of the first sliding plate and one end of the second sliding plate are respectively articulated to the first supporting plate and the second supporting plate; and when the first sliding plate is turned to a vertical position, an outer side surface of the first sliding plate is coincided with an inner side surface of the first limiting plate, and when the second sliding plate is turned to a vertical position, an outer side surface of the second sliding plate is coincided with an inner side surface of the second limiting plate.

Further, when the first supporting plate is connected to the adjacent second supporting plate, the guiding slot is engaged with a first united body formed by the first sliding plate and the first limiting plate, and when the two adjacent second supporting plates are connected, the guiding slot is engaged with a second united body formed by the second sliding plate and the second limiting plate on the adjacent second supporting plate.

Further, a first engaging slot and a first engaging block are respectively provided on the first sliding plate and the first supporting plate, and a second engaging slot and a second engaging block are respectively provided on the second sliding plate and each second supporting plate.

Further, the first limiting plate and the second limiting plate both have a cross section with an L shape.

Further, the first oblong hole and the second oblong hole extend upward to an outer side of the first sliding plate and an outer side of the second sliding plate, respectively.

Further, the positioning screw is provided with a locking nut, and the locking nut is a butterfly nut.

The effects according to the summary of the present application are merely the effects of the embodiments, and not all of the effects of the application. One of the above technical solutions has the following advantages or effects:

1. The buffer bracket not only can meet the installation requirement of the multi layers of expansion cards, but also can be adjusted in real time according to the distance between the expansion cards during the installation process, which has strong adaptability and is convenient to install.

2. The first supporting plate and the second supporting plate are slidably connected manner, and the adjacent second supporting plates are slidably connected, thus the buffer bracket can be adjusted in real time according to the distance between the expansion cards. On the one hand, it is easy to install, and on the other hand, it avoids generating stress inside the expansion card during the installation process.

3. The sliding plate is designed in a hinged manner, so that the sliding plate provided on the uppermost second supporting plate can be folded down, and the sliding plate is then fixed on the second supporting plate through the engaging block and the engaging slot, thereby saving the limited space inside the casing.

Figure 1:
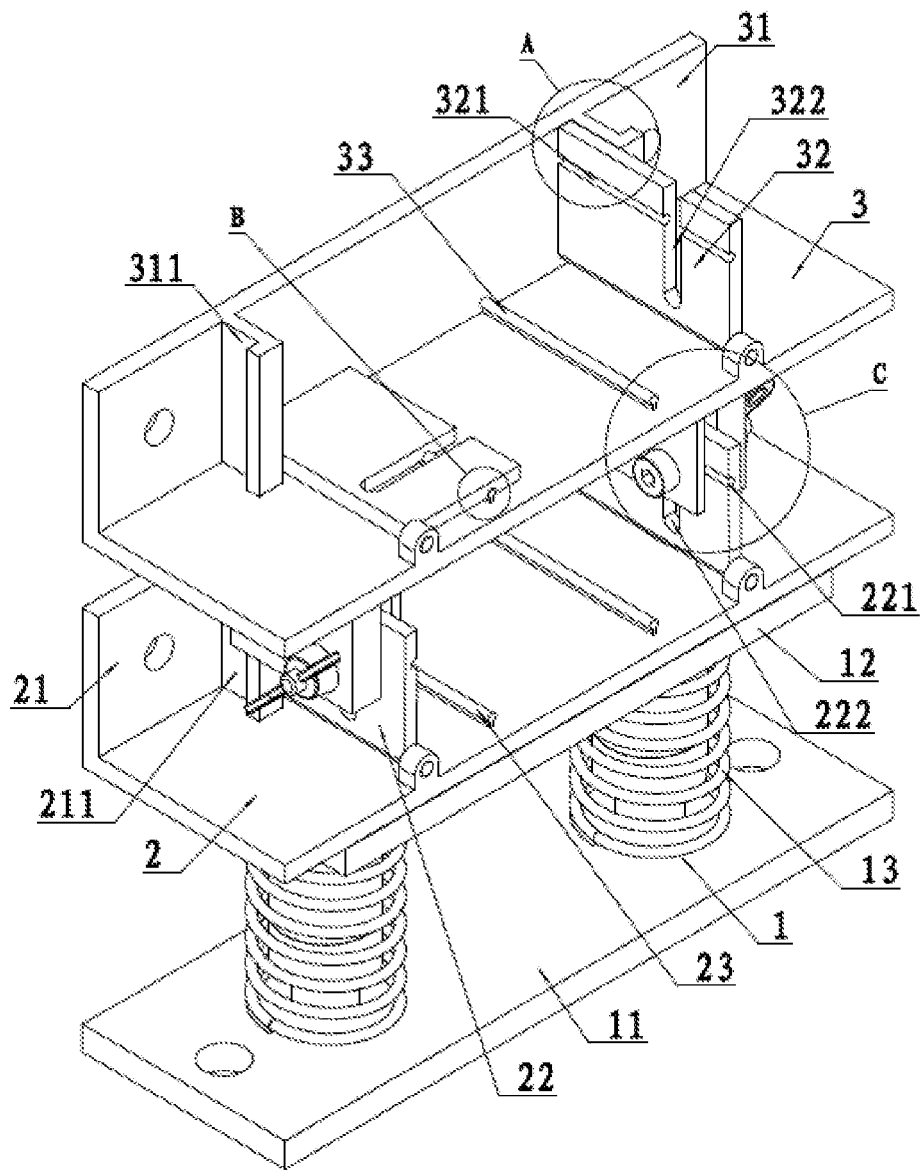
FIG. 1 is a perspective view showing the structure of a buffer bracket.

| Reference Numerals: | | | |
|---|---|---|---|
| 1 | elastic base, | 11 | bottom plate, |
| 111 | guiding pillar, | 12 | fixing plate, |
| 121 | guiding sleeve, | 122 | buffer cushion block, |
| 13 | spring, | 2 | first supporting plate, |

-continued

| Reference Numerals: | | | |
|---|---|---|---|
| 21 | first installing plate, | 211 | first limiting plate, |
| 22 | first sliding plate, | 221 | first engaging slot, |
| 222 | first oblong hole, | 23 | first engaging block, |
| 3 | second supporting plate, | 31 | second installing plate, |
| 311 | second limiting plate, | 32 | second sliding plate, |
| 321 | second engaging slot, | 322 | second oblong hole, |
| 33 | second engaging slot, | 34 | first guiding plate, |
| 35 | second guiding plate, | 36 | positioning screw, |
| 37 | locking nut, | 4 | extension card. |

DETAILED DESCRIPTION

In order to clearly illustrate the technical features of the present solution, the present application will be described in detail below through specific embodiments and in conjunction with the drawings. Many different embodiments or examples are provided according to the following disclosure to implement different structures of the present application. In order to simplify the disclosure of the present application, the components and arrangements of the specific examples are described below. Furthermore, reference numerals and/or letters may be repeated in different examples according to the present application. This repetition is for the purpose of simplicity and clarity, and is not intended to describe the relationship between the various embodiments and/or arrangements discussed. It is to be noted that the components illustrated in the drawings are not necessarily drawn to scale. The description of the known components and processing techniques and processes is omitted to avoid unnecessarily limiting the present application.

As shown in FIG. 1, a buffer bracket for multi layers of expansion cards includes an elastic base 1, a first supporting plate 2 and multiple second supporting plates 3, which are sequentially arranged from bottom to top. The first supporting plate 2 is fixedly connected to the elastic base 1, the first supporting plate 2 is slidably connected to the adjacent multiple second supporting plate 3, and the adjacent second supporting plates 3 are slidably connected.

As a specific embodiment, the number of the second supporting plates 3 in this embodiment is one.

Figure 7:
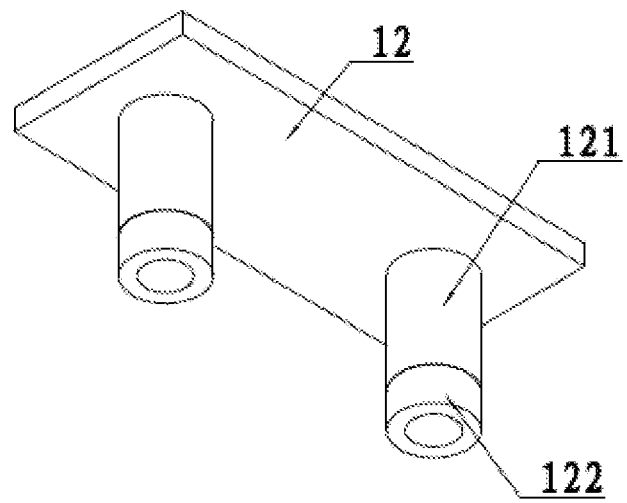
FIG. 7 is a perspective view showing the structure of a fixing plate.
Figure 8:
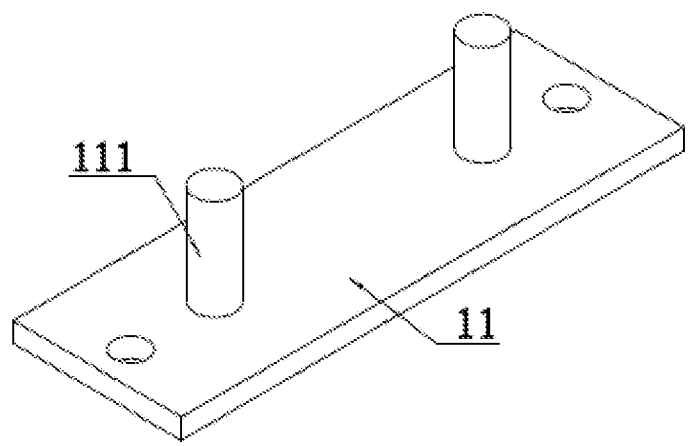
FIG. 8 is a perspective view showing the structure of a bottom plate.

As shown in FIGS. 1 and 8, the elastic base 1 includes a bottom plate 11 and a fixing plate 12 from bottom to top. A guiding pillar 111 is provided on an upper side surface of the bottom plate 11. As a specific embodiment, the bottom plate 11 according to this embodiment is provided with two guiding pillars 111. As shown in FIG. 7, a lower side surface of the fixing plate 12 is provided with two guiding sleeves 121 for cooperating with the two guiding pillars 111 respectively, and a spring 13 is sleeved on an outer side of each guiding sleeve 121 and is located between the bottom plate 11 and the fixing plate 12.

Further, as shown in FIG. 7, the lower end of each guiding sleeve 121 is provided with a buffer cushion block 122 of an annular shape, and the buffer cushion block 122 is coaxially arranged with the guiding sleeve 121, and is made of rubber. Thus, when the structure is collided, even if the springs 13 are compressed to the limit and the lower ends of the guiding sleeves 121 collide with the bottom plate 11, a rigid collision will not occur because the buffer cushion blocks 122 can also play a buffer effect.

Figure 4:
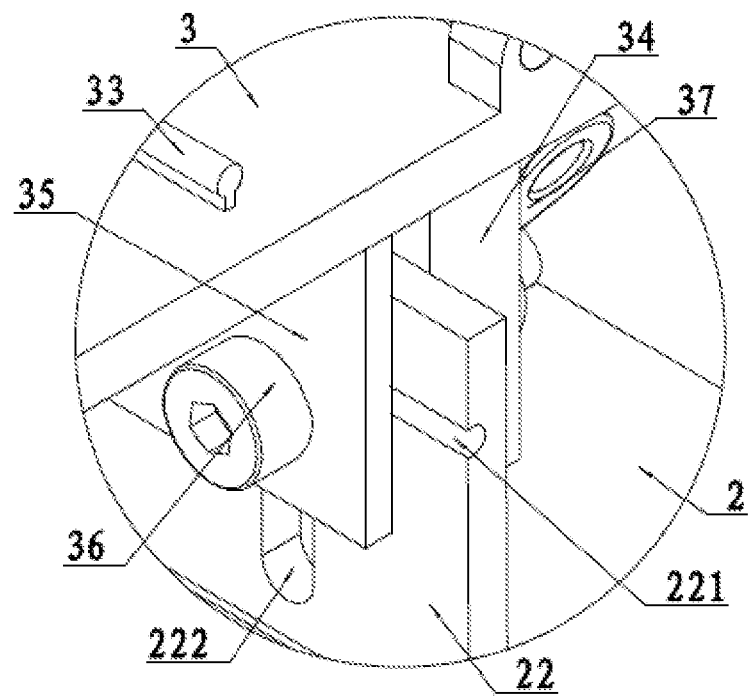
FIG. 4 is a schematic enlarged view of a portion C of FIG. 1.

As shown in FIGS. 1 and 4, an inner side (a side close to the expansion card 4 is referred to as the inner side) of the first supporting plate 2 is provided with a first installing plate 21 fixedly connected to the expansion card 4. A first supporting frame of an L shape is formed by the first installing plate 21 and the first supporting plate 2 together.

The left and right ends of the upper side surface of the first supporting plate 2 are respectively provided with two first sliding plates 22, and one end of each first sliding plate 22 is articulated to the first supporting plate 2. The outer sides (the opposite sides of the two first sliding plates 22 is referred to as inner sides) of the first sliding plates 22 located on the outer side (a side away from the expansion card 4 is referred to as the outer side) of the first installing plate 21 are respectively provided with two first limiting plates 211 arranged in a vertical direction. When the first sliding plates 22 are turned to a vertical position, the outer side surfaces of the first sliding plates 22 are coincided with the inner side surfaces of the first limiting plates 211 respectively.

As shown in FIG. 1, the inner side (the side close to the expansion card 4 is referred to as the inner side) of the second supporting plate 3 is provided with a second installing plate 31 fixedly connected to the expansion card 4. A second supporting frame of an L shape is formed by the second installing plate 31 and the second supporting plate 3 together.

The left and right ends of the upper side surface of the second supporting plate 3 are respectively provided with two second sliding plates 32, and one end of each second sliding plate 32 is articulated to the second supporting plate 3. The outer sides (the opposite sides of the two second sliding plates 32 is referred to as inner sides) of the second sliding plates 32 located on the outer side surface (the side away from the expansion card 4 is referred to as the outer side) of the second installing plate 31 are respectively provided with two second limiting plates 311 arranged in a vertical direction. When the second sliding plates 32 are turned to a vertical position, the outer side surfaces of the second sliding plates 32 are coincided with the inner side surfaces of the second limiting plates 311 respectively.

Figure 5:
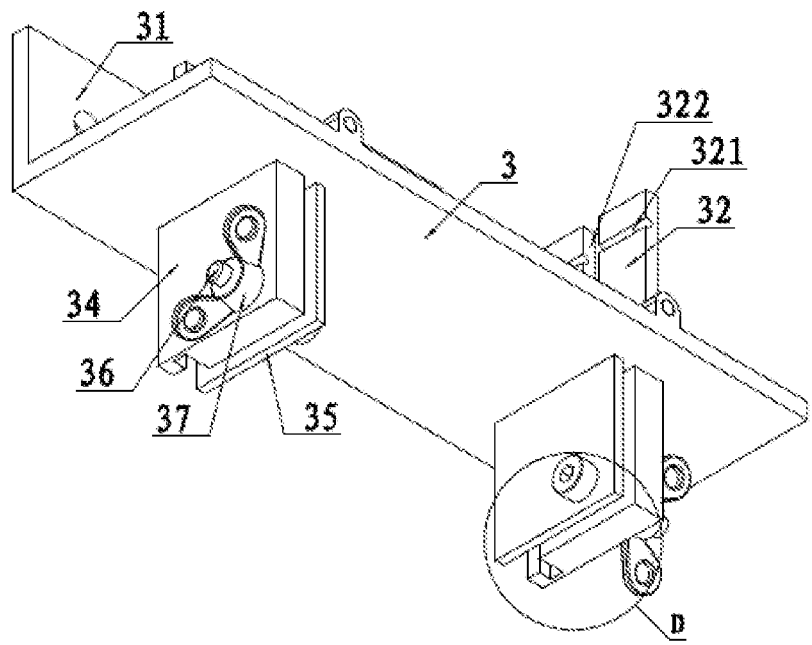
FIG. 5 is a perspective view showing the structure of a second supporting plate.
Figure 6:
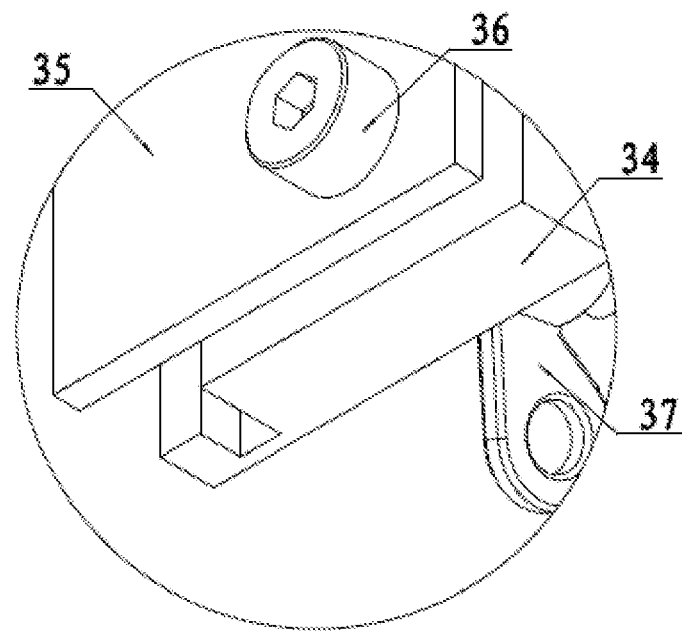
FIG. 6 is a schematic enlarged view of a portion D of FIG. 5.

As shown in FIGS. 5 and 6, a first guiding plate 34 and a second guiding plate 35 are respectively provided at the left side and the right side of each of the second sliding plates 32 on the lower side surface of the second supporting plate 3, and a guiding slot is formed by the first guiding plate 34 and the second guiding plate 35. When the first supporting plate 2 is connected to the second supporting plate 3, the guiding slots are engaged with first united bodies formed by the first sliding plates 22 and the first limiting plates 211 respectively, and when the two adjacent second supporting plates 3 are connected, the guiding slots are engaged with second united bodies formed by the second sliding plates 32 and the second limiting plates 311 on the adjacent second supporting plate 3 respectively.

Figure 2:
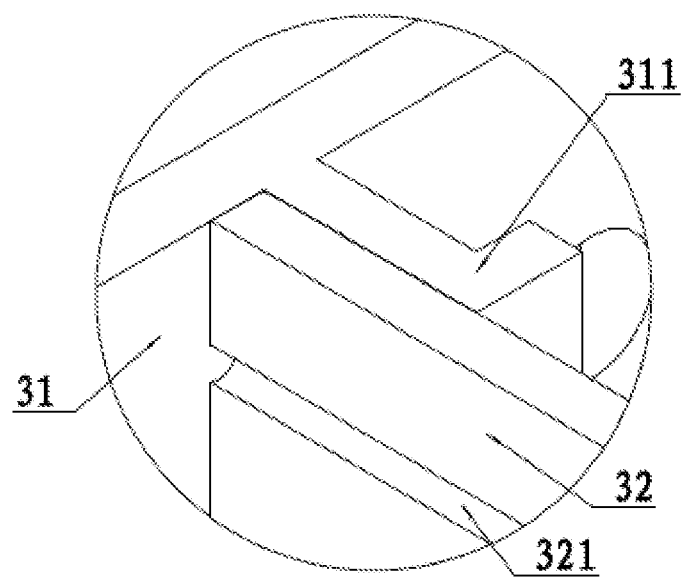
FIG. 2 is a schematic enlarged view of a portion A of FIG. 1.

Here, the first united body is a united structure formed by the first sliding plate 22 and the respective first limiting plate 211 when the first sliding plate 22 is turned to the vertical position; and the second united body is a united structure formed by the second sliding plate 32 and the respective second limiting plate 311 when the second sliding plate 32 is turned to the vertical position, as shown in FIG. 2.

As shown in FIG. 4, a positioning screw 36 is provided between the first guiding plate 34 and the second guiding plate 35, and the positioning screw 36 is provided with a locking nut 37, and the first sliding plate 22 and the second sliding plate 32 are respectively provided with a first oblong hole 222 and a second oblong hole 322 for accommodating the positioning screw 36.

In installation, the first supporting plate 2 is fixedly connected to the fixing plate 12 of the elastic base 1, and the elastic base 1 is fixedly connected to the casing together with the first supporting plate 2. The first sliding plate 22 is then turned to the vertical position, and the first united bodies formed by the first sliding plates 22 and the first limiting plates 211 are inserted into the guiding slots on the lower side of the second supporting plate 3. The rotation of the first sliding plates 22 is limited by the first guiding plates 34 and the second guiding plates 35. Then, the positioning screws 36 are inserted, the height of the second supporting plate 3 is adjusted, and then the locking nuts 37 are tightened.

Figure 3:
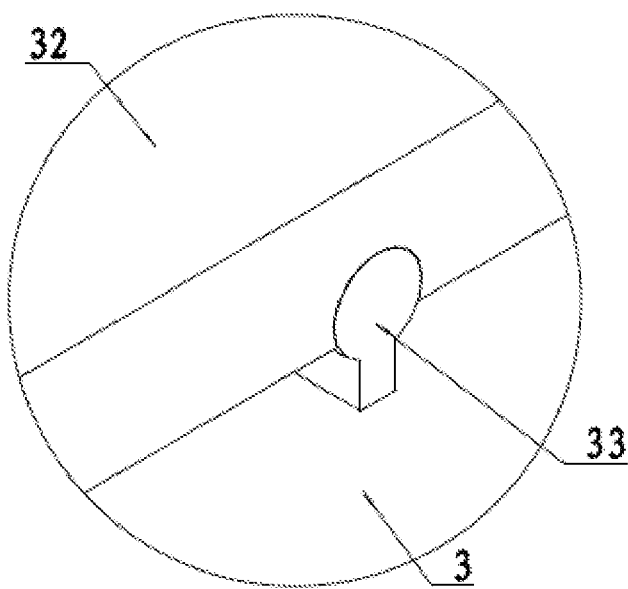
FIG. 3 is a schematic enlarged view of a portion B of FIG. 1.

Further, in order to avoid shaking of the first sliding plate 22 or the second sliding plate 32 which is not in operation, the inner side surface of each first sliding plate 22 is provided with a first engaging slot 221, and the inner side of each second sliding plate 32 is provided with a second engaging slot 321 as shown in FIGS. 1, 3 and 4. A first engaging block 23 for engaging with the first engaging slot 221 is provided on the first supporting plate 2 at the inner side of the first sliding plate 22. A second engaging block 33 for engaging with the second engaging slot 321 is provided on the second supporting plate 3 at the inner side of the second sliding plate 32.

As a specific employment, the first engaging block 23 and the second engaging block 33 described in this embodiment are all in a shape of a circle.

Figure 9:
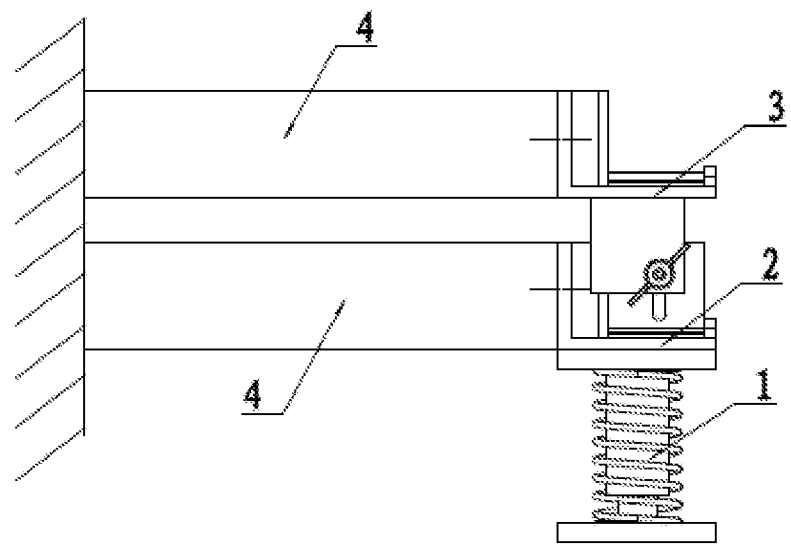
FIG. 9 is a schematic view showing the connection relationship between a buffer bracket and expansion cards.

Further, as shown in FIG. 9, since only one positioning screw 36 is used to fixedly connect the first supporting plate 2 to the second supporting plate 3, during the actual operation, the second supporting plate 3 may be turned over relative to the first supporting plate 2. Thus, as shown in FIGS. 1 and 2, the first limiting plate 211 and the second limiting plate 311 both have a cross section with an L shape, and one wing plate of the limiting plate (a collective name of the first limiting plate 211 and the second limiting plate 311) is oriented toward the outer side (the opposite sides of the limiting plates are referred to the inner side).

Further, for convenient installation, as shown in FIG. 1, the first oblong hole 222 and the second oblong hole 322 extend upward to the outer sides of the first sliding plate 22 and the second sliding plate 32, respectively. Notches are formed at the upper ends of the first sliding plate 22 and the second sliding plate 32. In this way, the positioning screw 36 is not required to be removed in installation. When the first united body is inserted into the guiding slot, the positioning screw 36 also enters the oblong hole.

Further, the locking nut 37 is a butterfly nut.

The above is only preferred embodiments of the present application, it should be noted that for ordinary technicians in the technical field several improvements and modifications can be made without departing from the principle of the present application, and these improvements and modifications are also deemed to be within the scope of protection of the present application.

The invention claimed is:

1. A buffer bracket for multi layers of expansion cards, comprising: an elastic base, a first supporting plate and a plurality of second supporting plates which are sequentially arranged from bottom to top, wherein the first supporting plate is fixedly connected to the elastic base, the first supporting plate is slidably connected to a second supporting plate adjacent to the first supporting plate, and any two adjacent second supporting plates are slidably connected;

wherein the elastic base comprises a bottom plate and a fixing plate, the bottom plate is provided with a guiding pillar, the fixing plate is provided with a guiding sleeve for cooperating with the guiding pillar, and a spring is sleeved on an outer side of the guiding sleeve;

wherein a lower end of the guiding sleeve is provided with a buffer cushion block made of rubber.

2. The buffer bracket for multi layers of expansion cards according to claim 1, wherein the guiding pillar extends upward from the bottom plate, the guiding sleeve extends downward from the fixing plate, the guiding sleeve is sleeved on the guiding pillar from top to bottom, the first supporting plate is fixedly connected to the fixing plate, and upper and lower ends of the spring respectively abut against the bottom plate and the fixing plate.

3. The buffer bracket for multi layers of expansion cards according to claim 1, wherein an upper side surface of the first supporting plate is provided with a first sliding plate, an upper side surface of each of the plurality of second supporting plates is provided with a second sliding plate, and a lower side surface of each of the plurality of second supporting plates is provided with a guiding slot;

when the first supporting plate is connected to the second supporting plate adjacent to the first supporting plate, the guiding slot of the second supporting plate adjacent to the first supporting plate is engaged with the first sliding plate of the first supporting plate; and when two adjacent second supporting plates are connected, the guiding slot of one of the two adjacent second supporting plates is engaged with the second sliding plate of the other of the two adjacent second supporting plates; and the guiding slot is provided with a positioning screw, and the first sliding plate and the second sliding plate are respectively provided with a first oblong hole and a second oblong hole for accommodating the positioning screw.

4. The buffer bracket for multi layers of expansion cards according to claim 3, wherein the lower side surface of each of the plurality of second supporting plates is provided with a first guiding plate and a second guiding plate at positions corresponding to left and right sides of the first sliding plate or the second sliding plate, and the guiding slot is formed by the first guiding plate and the second guiding plate; the positioning screw is provided in the guiding slot by passing through the first guiding plate and the second guiding plate in a left-right direction, a length direction of each of the first oblong hole and the second oblong hole is an up and down direction, and the first oblong hole and the second oblong hole are slidably engaged with the positioning screw in the up and down direction to achieve the slidable connections between the first supporting plate and the second supporting plate adjacent to the first supporting plate and between the two adjacent second supporting plates.

5. The buffer bracket for multi layers of expansion cards according to claim 3, wherein an inner side of the first supporting plate and an inner side of each of the plurality of second supporting plates are respectively provided with a first installing plate and a second installing plate for connecting an expansion card, the first installing plate and the second installing plate are respectively provided with a first limiting plate and a second limiting plate, one end of the first sliding plate and one end of the second sliding plate are respectively articulated to the first supporting plate and each of the plurality of second supporting plates; and when the first sliding plate is turned to a vertical position, an outer side surface of the first sliding plate is coincided with an inner side surface of the first limiting plate, and when the second sliding plate is turned to a vertical position, an outer side surface of the second sliding plate is coincided with an inner side surface of the second limiting plate.

6. The buffer bracket for multi layers of expansion cards according to claim 5, wherein when the first supporting plate is connected to the second supporting plate adjacent to the first supporting plate, the guiding slot of the second supporting plate adjacent to the first supporting plate is engaged with a first united body formed by the first sliding plate and the first limiting plate, and when the two adjacent second supporting plates are connected, the guiding slot of one of the two adjacent second supporting plates is engaged with a second united body formed by the second sliding plate and the second limiting plate of the other of the two adjacent second supporting plates.

7. The buffer bracket for multi layers of expansion cards according to claim 5, wherein a first engaging slot and a first engaging block are respectively provided on the first sliding plate and the first supporting plate, and a second engaging slot and a second engaging block are respectively provided on the second sliding plate and each second supporting plate.

8. The buffer bracket for multi layers of expansion cards according to claim 5, wherein the first limiting plate and the second limiting plate both have a cross section with an L shape.

9. The buffer bracket for multi layers of expansion cards according to claim 3, wherein the first oblong hole and the second oblong hole extend upward to an outer side of the first sliding plate and an outer side of the second sliding plate, respectively.

10. The buffer bracket for multi layers of expansion cards according to claim 3, wherein the positioning screw is provided with a locking nut, and the locking nut is a butterfly nut.

11. The buffer bracket for multi layers of expansion cards according to claim 1, wherein the guiding pillar extends upward from the bottom plate, the guiding sleeve extends downward from the fixing plate, the guiding sleeve is sleeved on the guiding pillar from top to bottom, the first supporting plate is fixedly connected to the fixing plate, and upper and lower ends of the spring respectively abut against the bottom plate and the fixing plate.

* * * * *